United States Patent
Berge et al.

(10) Patent No.: US 11,538,638 B2
(45) Date of Patent: Dec. 27, 2022

(54) CO-AXIAL GRID ARRAY CAPACITOR ASSEMBLY

(71) Applicant: International Business Machines Corporation, Armonk, NY (US)

(72) Inventors: Layne A. Berge, Rochester, MN (US); Matthew Doyle, Chatfield, MN (US); John R. Dangler, Rochester, MN (US); Kyle Schoneck, Rochester, MN (US); Thomas W. Liang, Rochester, MN (US); Matthew A. Walther, Rochester, MN (US); Jason J. Bjorgaard, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 16/918,251

(22) Filed: Jul. 1, 2020

(65) Prior Publication Data

US 2022/0005649 A1    Jan. 6, 2022

(51) Int. Cl.
*H01G 4/35*    (2006.01)
*H05K 1/02*    (2006.01)
(Continued)

(52) U.S. Cl.
CPC .............. *H01G 4/35* (2013.01); *H01G 4/28* (2013.01); *H01L 28/60* (2013.01); *H05K 1/0231* (2013.01); *H05K 1/162* (2013.01)

(58) Field of Classification Search
CPC ............ H01G 4/35; H01G 4/28; H01G 4/228; H01G 4/242; H01G 4/38; H01G 4/40;
(Continued)

(56) References Cited

U.S. PATENT DOCUMENTS

| | | | | |
|---|---|---|---|---|
| 2,974,396 A | * | 3/1961 | Allison | H01G 4/32 264/168 |
| 3,231,800 A | * | 1/1966 | Scherr, III | H01G 4/228 361/273 |

(Continued)

FOREIGN PATENT DOCUMENTS

| | | |
|---|---|---|
| CN | 102044531 A | 5/2011 |
| CN | 107735860 A | 2/2018 |

(Continued)

OTHER PUBLICATIONS

No. TE04EA-1, Murata Manufacturing Co., Ltd., Downloaded Nov. 21, 2019, pp. 17-19. https://www.murata.com/~/media/webrenewal/products/emc/emifil/knowhow/20to22.ashx.

(Continued)

*Primary Examiner* — David M Sinclair
*Assistant Examiner* — Daniel M Dubuisson
(74) *Attorney, Agent, or Firm* — Mark Bergner

(57) ABSTRACT

A grid array capacitor can be used to physically and electrically couple an integrated circuit (IC) package to a printed circuit board (PCB). The grid array capacitor includes an inner conductor and an inner dielectric coaxially surrounding the inner conductor. A secondary conductor can be located to surround, in a coaxial orientation, the inner dielectric. Both the inner conductor and the secondary conductor can be electrically connected to the IC package and to the PCB. In certain applications, the structure of the inner conductor, inner dielectric, and secondary conductor can provide capacitance used to decouple electronic circuits.

13 Claims, 4 Drawing Sheets

(51) Int. Cl.
  *H01G 4/28* (2006.01)
  *H01L 49/02* (2006.01)
  *H05K 1/16* (2006.01)

(58) Field of Classification Search
  CPC ...... H01L 28/60; H05K 1/0231; H05K 1/162; H05K 2201/09609; H05K 2201/10015; H05K 2201/10265; H05K 2201/10378; H05K 1/184
  See application file for complete search history.

(56) References Cited

U.S. PATENT DOCUMENTS

| | | | | |
|---|---|---|---|---|
| 3,970,903 | A * | 7/1976 | Shim | H01G 9/012 29/25.03 |
| 4,586,112 | A * | 4/1986 | MacDougall | H01G 4/385 361/330 |
| 5,590,016 | A | 12/1996 | Fujishiro et al. | |
| 5,786,979 | A | 7/1998 | Douglass | |
| 6,079,089 | A | 6/2000 | Quick et al. | |
| 6,297,524 | B1 | 10/2001 | Vathulya et al. | |
| 6,479,764 | B1 * | 11/2002 | Frana | H05K 1/0222 174/262 |
| 6,493,206 | B1 * | 12/2002 | King | H01G 2/14 361/308.1 |
| 6,515,842 | B1 | 2/2003 | Hayworth et al. | |
| 7,268,419 | B2 * | 9/2007 | Cornelius | H01L 24/13 257/E23.079 |
| 7,335,966 | B2 | 2/2008 | Ihme et al. | |
| 7,538,006 | B1 | 5/2009 | Anderson | |
| 9,257,499 | B2 | 2/2016 | Pagani | |
| 9,629,259 | B1 | 4/2017 | Hart et al. | |
| 9,653,533 | B2 | 5/2017 | Jow et al. | |
| 9,659,850 | B2 | 5/2017 | We | |
| 2004/0149490 | A1 | 8/2004 | Chang | |
| 2007/0289773 | A1 * | 12/2007 | Caletka | H05K 1/0219 174/262 |
| 2008/0122031 | A1 * | 5/2008 | DeNatale | H01G 4/40 257/532 |
| 2011/0096521 | A1 * | 4/2011 | Randall | H05K 1/0231 361/782 |
| 2019/0341196 | A1 * | 11/2019 | Carver | H02J 7/345 |
| 2019/0378657 | A1 * | 12/2019 | Lu | H01G 4/232 |
| 2020/0168535 | A1 | 5/2020 | Becker | |

FOREIGN PATENT DOCUMENTS

| | | | |
|---|---|---|---|
| GB | 909817 | A * | 11/1962 |
| JP | 2014241365 | A | 12/2014 |

OTHER PUBLICATIONS

"What is CCGA Column Grid Array?", TopLine, Printed: Jan. 10, 2020, 6 pages. https://www.topline.tv/CCGA_Whatis.html.

PCT /IB2021/054293, International Search Report and Written Opinion, dated Sep. 6, 2021.

* cited by examiner

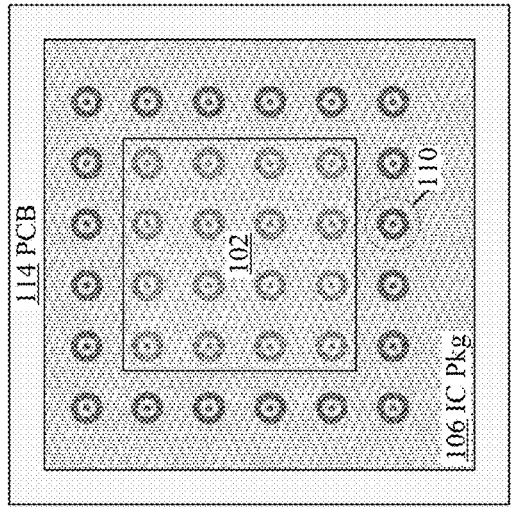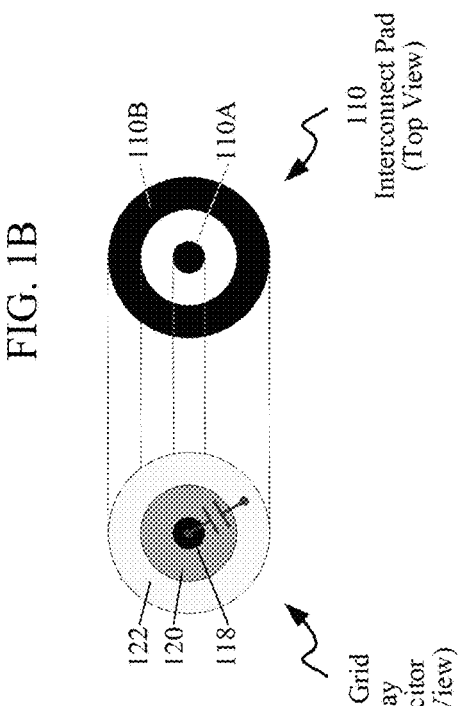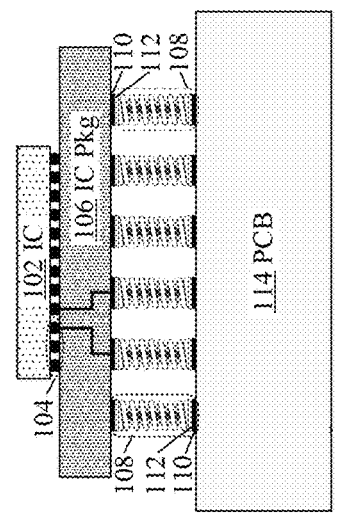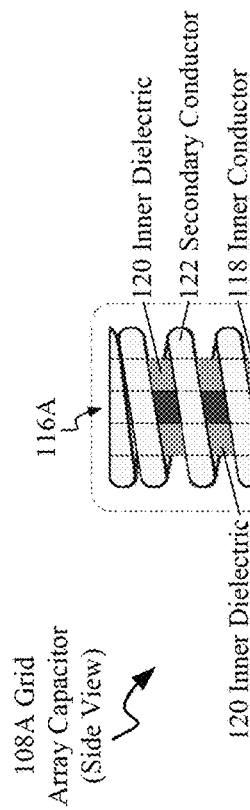
FIG. 1A — 100 Electronic System (Side View)
FIG. 1B — 150 Electronic System (Top View)
FIG. 1C — 108A Grid Array Capacitor (Side View)
FIG. 1D — 108B Grid Array Capacitor (Top View); 110 Interconnect Pad (Top View)

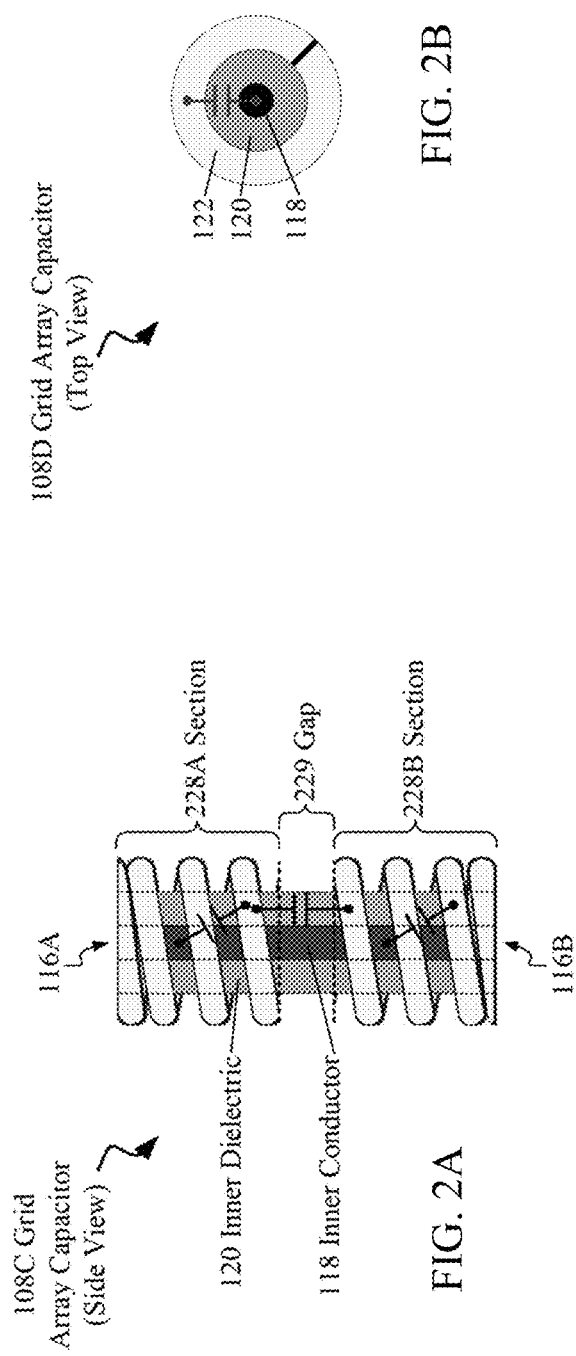
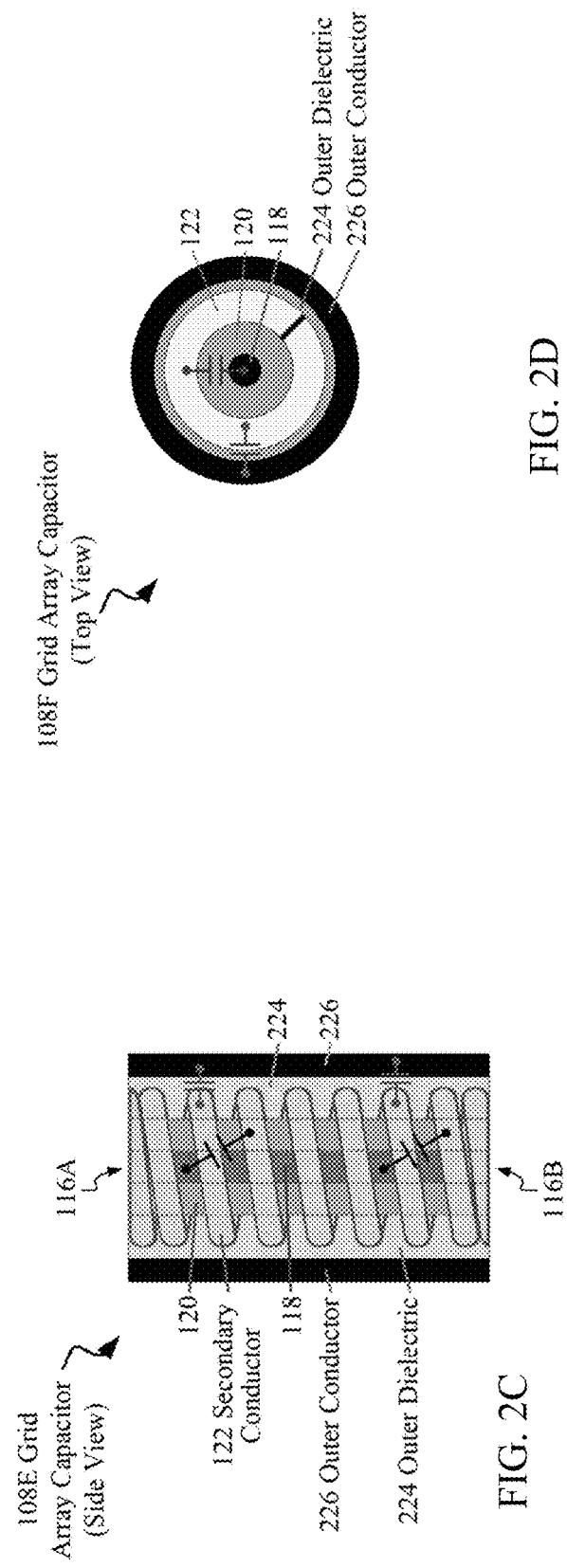

300 Capacitor Equivalent Circuits Including ESL 
302 2-Terminal Circuit 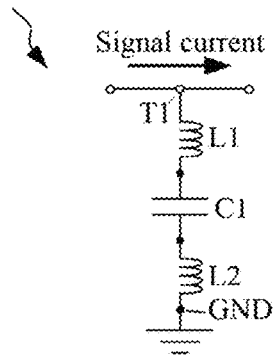
300 Capacitor Equivalent Circuits Including ESL 
304 3-Terminal Circuit 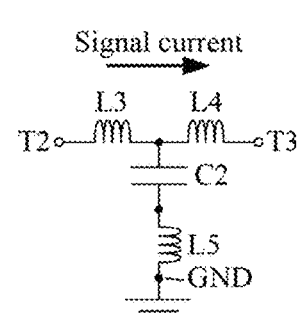
FIG. 3A
FIG. 3B
350 Capacitor Insertion Loss Characteristics 
FIG. 3C

CO-AXIAL GRID ARRAY CAPACITOR ASSEMBLY

BACKGROUND

The present disclosure generally relates to electronic interconnect structures. In particular, this disclosure relates to grid array capacitors that can be attached to an integrated circuit (IC) package and to a printed circuit board (PCB).

A capacitor is a passive electrical component having at least two electrical conductors known as plates, separated by a dielectric or insulator, and which can be used to electrostatically store energy in an electric field. Capacitors can be useful as circuit elements in conjunction with a variety of types of electronic devices such as digital and analog ICs.

A decoupling capacitor can be used to decouple or electrically isolate one part of an electrical circuit or network from another part of the circuit. Electrical noise generated by certain circuit elements can be shunted through a decoupling capacitor. Decoupling capacitors can be particularly useful for shunting or bypassing high-frequency noise components around noise-sensitive circuitry such as filters, amplifiers and logic elements.

Solder columns or balls can be used to provide electrical and mechanical interconnection of an IC package to a PCB. Such solder columns can be arranged in an array formation between planar surfaces of the IC package and of the PCB. The IC package can be attached to the PCB by reflowing the solder columns to attachment pads located on the IC package and PCB surfaces.

SUMMARY

Embodiments can be directed towards a grid array capacitor located between an integrated circuit (IC) package and a printed circuit board (PCB). The grid array capacitor can be configured to be physically and electrically coupled to the IC package and to the PCB. The grid array capacitor can include an inner conductor configured to be electrically connected to the integrated circuit (IC) package and to the PCB and an inner dielectric in a coaxial orientation to, and at least partially surrounding the inner conductor. The grid array capacitor can also include a secondary conductor in a coaxial orientation to, and at least partially surrounding the inner dielectric. The secondary conductor can be configured to be electrically connected to the IC package and to the PCB.

Embodiments can also be directed towards an electronic system. The electronic system can include a PCB, an IC package, and a grid array capacitor located between the IC package and the PCB. The grid array capacitor can be physically and electrically coupled to the IC package and to the PCB. The grid array capacitor can include an inner conductor physically and electrically connected to the IC package and to the PCB an inner dielectric in a coaxial orientation to and at least partially surrounding the inner conductor. The grid array capacitor can also include a secondary conductor in a coaxial orientation to and at least partially surrounding the inner dielectric. The secondary conductor can be physically and electrically connected to the IC package and to the PCB.

Embodiments can also be directed towards a method of manufacturing a grid array capacitor. The grid array capacitor can be located between an IC package and a PCB of an electronic system. The method can include inserting an inner dielectric into an axially-oriented opening of a secondary conductor and forming, in the inner dielectric, an opening suitable to receive an inner conductor. The method can also include inserting the inner conductor into the opening in the inner dielectric and applying solder paste to opposing ends of the secondary conductor and to opposing ends of the inner conductor. The method can also include electrically and mechanically interconnecting the grid array capacitor to an IC package and to a PCB by reflowing the solder paste applied to the opposing ends of the secondary conductor and to the inner conductor.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

FIG. 1A is a side view of an electronic system comprising grid array capacitors, according to embodiments of the present disclosure.

FIG. 1B is a top view of the electronic system shown in FIG. 1A, according to embodiments of the present disclosure.

FIG. 1C is a side view of an individual grid array capacitor, according to embodiments of the present disclosure.

FIG. 1D is a top view of a grid array capacitor as shown in FIG. 1C, according to embodiments of the present disclosure.

FIG. 2A is a side view of a grid array capacitor having a secondary conductor with two sections, according to embodiments of the present disclosure.

FIG. 2B is a top view of a grid array capacitor having a secondary conductor with two sections, according to embodiments of the present disclosure.

FIG. 2C is a side view of a grid array capacitor having three conductors, according to embodiments of the present disclosure.

FIG. 2D is a top view of a grid array capacitor having three conductors, according to embodiments of the present disclosure.

FIG. 3A is a schematic view of a two-terminal grid array capacitor circuit, according to embodiments of the present disclosure.

FIG. 3B is a schematic view of a three-terminal grid array capacitor circuit, according to embodiments of the present disclosure.

FIG. 3C is a graph depicting insertion loss characteristics of grid array capacitors, according to embodiments consistent with the figures.

Figure 4A:
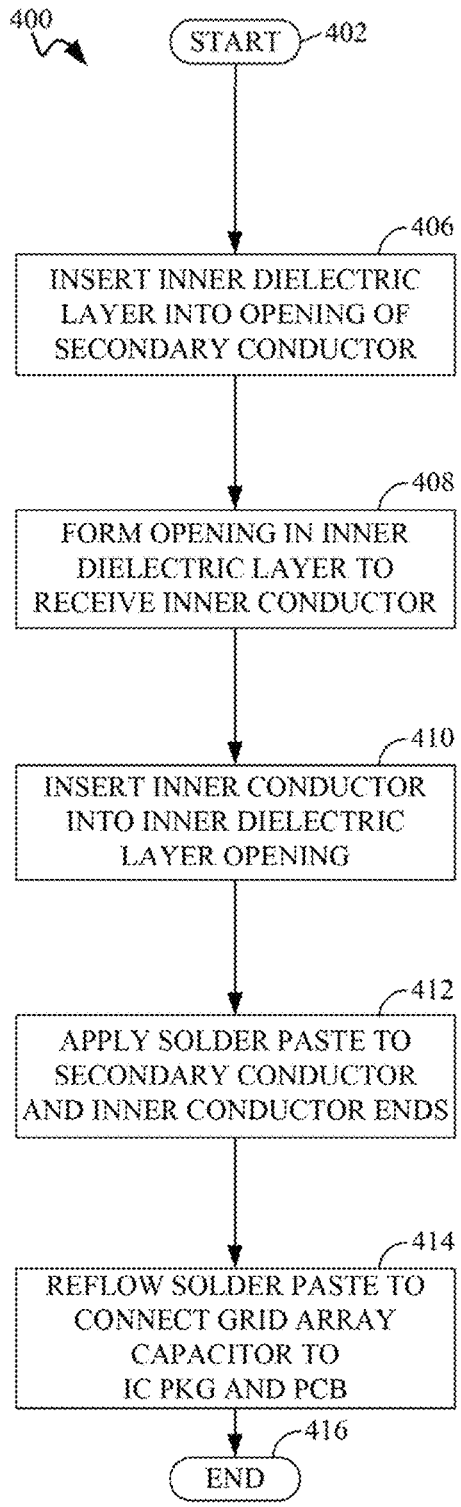
FIG. 4A is a flowchart illustrating a process for manufacturing a grid array capacitor located between an integrated circuit (IC) package and a printed circuit board (PCB), according to embodiments consistent with the figures.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing grid array capacitors used to interconnect integrated circuit (IC) packages to printed circuit boards (PCB) within electronic equipment such as servers, which may be used to provide data to clients attached to a server through a network. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing grid array capacitors used to interconnect IC packages to PCBs within electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing grid array capacitors used to interconnect IC packages to PCBs within consumer and small office/home office (SOHO) electronic equipment such as personal computers, laptops, mobile and network server devices.

The terms "attachment pad," and "BGA (ball grid array) pad" can be used interchangeably herein in reference to a metallic pad used to form an electrical and mechanical interconnection to an IC package or a PCB. Such pads can include metals such as copper or copper alloys, and can be arranged in arrays that are positionally consistent with solder balls on a BGA electronic package. In the context of the present disclosure, attachment pads can be used as locations on which to place and reflow solder balls to electrically and mechanically interconnect an IC package to a PCB.

For ease of discussion, the terms "solder, "solder paste" and "solder balls" are used generally herein in reference to an electrically conductive attachment material used to form a durable mechanical and electrical interconnection between an IC package and a PCB.

The terms "secondary conductor" and "outer conductor" are used herein in reference to electrical conductors included within a grid array capacitor. In the context of the present disclosure, it can be understood that the terms "secondary conductor" and "outer conductor" may each be used interchangeably with the term "columnar conductive sleeve."

A dielectric constant (Dk), also known as the "relative permittivity" of a dielectric or insulating material can be understood to be the ratio of the amount of charge stored in response to an insulating material being placed between two metallic plates to the amount of charge that can be stored when the insulating material is replaced by a vacuum or by air.

ICs such as processors, graphics processing units (GPUs), memory chips and application-specific integrated circuits (ASICs) can be electrically and mechanically attached to a PCB through the use of reflowed solder columns or solder balls. Such solder columns or balls can be arranged in an array formation, which can be particularly useful for providing a large number of high-density power and signal interconnections between an IC package and the PCB. Continuing trends of increasing IC operational frequencies and signal slew rates in conjunction with the increased use of high-speed serial (HSS) data interfaces have resulted in the need for increased power supply decoupling and AC (alternating current) coupling capacitance at IC package/PCB interfaces.

Such increased capacitance can be provided by surface-mount technology (SMT) capacitors placed on the PCB adjacent to the IC package. Placement of these additional SMT capacitors, however, may complicate the routing of wiring within a "breakout" or "escape" area on the PCB. A breakout area generally includes a large number of closely-arranged wires and BGA pads under the IC package. These wires are used to fan out the wiring to wiring regions on the PCB that have more relaxed spacing constraints.

Area for wiring within breakout regions is generally very limited, and certain signal net types, e.g., differential pairs, can require precise balancing of paired wire lengths in order for the differential signals carried on them to meet electrical design constraints. Disrupting wiring flow, e.g., by including SMT capacitors within the breakout area, can therefore cause significantly increased design complexity, and in some cases, cause critical electrical design requirements, e.g., wiring length and/or length matching, to go unmet.

According to embodiments, solder column grid array capacitors can provide additional decoupling or AC coupling capacitance at an IC package/PCB interface without disrupting wiring flow of a wiring breakout area on the PCB. The use of such small geometry capacitors can enhance PCB wiring flow, which can allow electrical design constraints to be met without excessive design or PCB wiring layout effort. The use of solder column grid array capacitors can also provide additional capacitance to ICs without additional series inductance (ESL) resulting from PCB surface wiring and/or vias. This additional capacitance can be particularly useful for decoupling IC power supply rails and for AC coupling HSS data signals.

Various aspects of the present disclosure may be useful for providing HSS and decoupling capacitance solutions within the framework of an existing columnar attach mechanism. Such solutions may not disturb sensitive PCB breakout wiring constraints. Various embodiments can eliminate the need for discrete (SMT) capacitors and the parasitic inductive losses associated with capacitor wiring breakout. Certain embodiments can be particularly useful in providing improved insertion loss by implementing three-terminal capacitors within the framework of an existing columnar attach mechanism. Such embodiments can also include integrated signal paths.

Grid array capacitors designed according to certain embodiments may be compatible with existing and proven PCBs and IC packages may be a useful and cost-effective way to provide increased decoupling and AC coupling capacitance. Embodiments of the present disclosure can be useful in providing a variety of interconnect topologies between a PCB and an IC package that support AC coupling, direct current (DC) connections, and power supply decoupling.

It can be understood that the elements depicted in the figures are provided for conceptual illustration only, and are not necessarily drawn to scale. For example, structures can be depicted as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

Embodiments of the present disclosure can include a variety of configurations and signal paths/path types. For example, various embodiments can include solder column grid array capacitors having no DC paths, one or more DC paths, an AC path or an AC path with severed inner conductor. Embodiments can generally have a coaxial structure, e.g., including two or three electrical conductors that are electrically insulated from each other by generally cylindrical dielectric layers. This description is not limiting, however, other structures can be included within the spirit and scope of the present disclosure.

Certain embodiments relate to the use of grid array capacitors in electronic systems to electrically interconnect IC packages to PCBs. FIGS. 1A-1B includes views 100, 150 depicting side and top views, respectively, of an electronic system. FIGS. 1C-1D include views 108A, 108B depicting side and top views, respectively, of a grid array capacitor and view 110 depicting an interconnect pad, according to embodiments of the present disclosure. FIG. 1A can be particularly useful in depicting and providing an understanding of the physical structure of a grid array capacitor 108 and the placement and interconnection of an IC package 106 to a PCB 114 through the use of multiple grid array capacitors 108. It can be understood that the views included in FIGS. 1A-1D are provided for the purpose of illustration only, and may not accurately represent dimensions, proportions, quantities or other physical features of elements such as PCBs, IC packages, ICs and grid array capacitors.

In FIGS. 1A-1B, view 100 includes an IC 102 mounted with solder balls 104 onto an IC package 106. IC package 106 is attached to PCB 114 by grid array capacitors 108 located between IC package 106 and PCB 114. IC package 106 and PCB 114 both have a positionally corresponding set of interconnect pads 110 on opposing planer surfaces, consistent with interconnect pads used for solder column and solder ball interconnection of IC packages to PCBs. Such interconnect pads can include a conductive material such as copper or a copper alloy. According to embodiments, grid array capacitor ends, e.g., 116A and 116B, view 108A, are attached to interconnect pads 110 by solder 112. In embodiments, solder 112 is applied to interconnect pads 110 and reflowed to form stable electrical and mechanical connections between IC package 106, grid array capacitor 108 and PCB 114. Grid array capacitor ends 116A and 116B can be solder plated prior to reflow in order to enhance the reflow process.

In embodiments, IC 102 can be an IC such as a processor or GPU chip, IC package 106 can be a ceramic or organic multi-layer substrate, and PCB 114 can include, for example, a motherboard or daughter card. Solder balls 104 can be formed from a high-temperature solder that is reflowed in conjunction with a lower-temperature solder paste to form a bond between IC 102 and IC package 106.

In FIG. 1A, view 100 can be particularly useful for depicting desirable electrical and mechanical connections of IC package 106 to PCB 114 using grid array capacitors 108. Such connections/coupling can be electrically and mechanically stable while compensating for differences in planarity of opposing surfaces of IC package 106 and PCB 114. In some applications, such planarity differences may be due to warp caused by coefficient of thermal expansion (CTE) differences between IC package 106 and PCB 114, or due to manufacturing tolerances.

The assembly depicted in view 100 can thus be understood by one of skill in the art of electrical package and/or electrical system design to be an exemplary IC package and PCB assembly. The structure of grid array capacitors 108, as depicted, is understood to generally yield electrical and mechanical connections that are robust, durable and reliable over an extended time period. Grid array capacitors 108 are particularly useful in providing capacitance useful for IC power rail decoupling and HSS AC coupling at the IC package 106/PCB 114 interface, while not consuming excess surface area on PCB 114 in addition to area that a solder ball or solder column interconnect structure would occupy. In FIG. 1B, electronic system top view 150, consistent with side view 100, is useful in depicting the relative positioning of PCB 114, IC package 106, IC 102 and interconnect pads 110.

In FIGS. 1C-1D, views 108A and 108B depict an expanded view of a grid array capacitor 108 consistent with view 100. Grid array capacitors 108 can provide, at the IC package 106/PCB 114 interface, capacitance that is useful for decoupling IC power supplies and for AC coupling of HSS signals.

According to embodiments, grid array capacitor 108 includes an inner conductor 118 configured to be electrically connected to the IC package 106 and to the PCB 114. In some embodiments, the inner conductor 118 is a wire, and in some embodiments, the inner conductor 118 can be a helical coil. Inner dielectric 120 is positioned in a coaxial orientation to and at least partially surrounding inner conductor 118. The inner dielectric 120 can be understood to be a dielectric "plug," and can include, for example, materials such as polyimide and/or barium titanate.

Secondary conductor 122 is in a coaxial orientation to and at least partially surrounding the inner dielectric 120. The secondary conductor 122 is configured to be electrically connected to the IC package 106 and to the PCB 114. In some embodiments, secondary conductor 122 can be a conductive helical structure or coil, as depicted in view 108A. A secondary conductor 122 that is a conductive helical structure or coil can be useful for compensating for non-uniformities in planarity and/or distance between opposing surfaces of IC package 106 and PCB 114. The use of such helical structures can provide electrical interconnections that are mechanically robust over a wide variety of thermal and dimensional variances of both IC package 106 and PCB 114.

In some embodiments, secondary conductor 122 can be a hollow, electrically conductive cylindrical structure or sleeve. Secondary conductor 122 may also be referred to as a "columnar conductive sleeve." The inner conductor 118 and secondary conductor 122 can include materials such as copper, tin, nickel, niobium and titanium.

In some embodiments the inner dielectric 120 can have a Dk value between 100 and 5,000, which, in conjunction with inner conductor 118 and secondary conductor 122 can yield a grid array capacitor 108 capacitance in a range between 1 nF and 8 nF. This capacitance can be particularly useful for decoupling IC 102 power supplies and for AC coupling of HSS signals electrically interconnected to IC 102. Future technology development may include the use of dielectric materials having Dk values greater than 5,000, which may provide for proportionally greater capacitance values of grid array capacitors.

Grid array capacitors 108 can be used to establish a variety of types of electrical interconnections between IC 102 and PCB 114. It can be understood that the inner conductor 118 and secondary conductor 122 can each be used for power, ground, or signals, as needed. Capacitances between inner conductors 118 and secondary conductors 122 can be used for power supply decoupling and/or AC coupling.

For example, a grid array capacitor 108 can form two electrical interconnect paths, e.g., a power supply voltage and ground node, between IC package 106 and PCB 114. In this example, capacitances between an inner conductor 118 and a secondary conductor 122 can be used for IC 102 power supply decoupling. In certain embodiments, at least one of inner conductor 118 and secondary conductor 122 can be left electrically disconnected from either IC package 106 or PCB 114. In some embodiments, grid array capacitor 108A can provide AC coupling between IC package 106 and PCB 114. Such AC coupling can be used in conjunction with HSS interfaces of IC 102.

In FIG. 1D, view 110 depicts an interconnect pad having interconnect pad 110A positionally corresponding to inner conductor 118 and interconnect pad 110B positionally corresponding to secondary conductor 122. In embodiments, inner conductor 118 can be physically and electrically connected to interconnect pad 110A through a solder reflow operation. Secondary conductor 122 can similarly be physically and electrically connected to interconnect pad 110B.

FIGS. 2A-2B depict, in views 108C, 108D, a grid array capacitor having a secondary conductor 122 with two sections 228A and 228B. FIGS. 2C-2D depict, in views 108E, 108F, a grid array capacitor having three conductors 118, 122 and 226, according to embodiments of the present disclosure. Views 108C, 108D, 108E and 108F are generally consistent with FIGS. 1A-1D.

Consistent with view 108A, grid array capacitor 108C includes inner conductor 118 and inner dielectric 120. Grid array capacitor 108C also includes a secondary conductor 122 (see view 108A, FIG. 1C) section 228A adjacent to end 116A and section 228B adjacent to end 116B. According to embodiments, section 228A and section 228B are physically separated by gap 229 and are therefore electrically insulated from each other; no DC connection is therefore possible between sections 228A and 228B.

According to embodiments, gap 229 can be formed by a severing of secondary conductor 122, FIGS. 1C-1D, or it can be formed by the placement of two separate sections 228A, 228B. It can be understood that the inner conductor 118 can be used for power, ground, or signals, as needed. In embodiments, capacitive coupling between sections 228A and 228B of grid array capacitor 108C can be useful in providing AC coupling or power supply decoupling between IC package 106 and PCB 114.

Grid array capacitor 108D (top view), consistent with view 108B, FIG. 1D, depicts secondary conductor 122, inner dielectric 120 and inner conductor 118. Consistent with view 108A, FIG. 1C, grid array capacitor 108E includes inner conductor 118, inner dielectric 120 and secondary conductor 122. Grid array capacitor 108C also includes outer dielectric 224 and outer conductor 226. According to embodiments, outer dielectric 224 is located in a coaxial orientation to and at least partially surrounding the secondary conductor 122. Outer conductor 226 is in a coaxial orientation to and at least partially surrounding the outer dielectric 224. Outer conductor 226 is configured to be electrically connected to the IC package 106 and to the PCB 114, FIGS. 1A-1B.

It can be understood that the inner conductor 118, secondary conductor 122 and outer conductor 226 can each be used for power, ground, or signals, as needed. In embodiments, capacitive coupling between the inner conductor 118, secondary conductor 122 and outer conductor 226 of grid array capacitor 108C can be useful in providing AC coupling or power supply decoupling between IC package 106 and PCB 114.

A grid array capacitor 108 configured as a three-terminal capacitor structure can have certain advantageous electrical properties, namely decreased ESL and improved insertion loss relative to a two-terminal capacitor structure. It is understood that ESL in, for example, a decoupling capacitor effectively reduces the capacitance available to act as a filter of power supply noise/transients. The electrical properties and benefits of such three-terminal capacitor structures are further discussed in reference to FIGS. 3A-3C.

In the practice of the present disclosure, outer dielectric 224 and outer conductor 226 can be formed together, and subsequently positioned to surround inner conductor 118, inner dielectric 120 and secondary conductor 122. For example, outer conductor 226 can be formed as a hollow cylindrical conductive tube, and the inner surface subsequently coated with outer dielectric 224 with a process such as spraying, or dipping. Alternatively, a sheet of conductive material, e.g., copper, can be coated on one surface with outer dielectric 224, and subsequently rolled or stamped to form a cylindrical shape. Following the fabrication of the outer dielectric 224/outer conductor 226 assembly, this assembly can be positioned so as to surround the secondary conductor 122. The outer dielectric 224 can include, for example, polyimide and/or barium titanate. Outer conductor 226 can include materials such as copper, tin, nickel, silver and gold. Grid array capacitor 108F (top view), consistent with view 108E, depicts inner conductor 118, inner dielectric 120, secondary conductor 122, outer dielectric 224 and outer conductor 226.

FIGS. 3A-3B are schematic circuit diagrams showing capacitor equivalent circuits 300, and include schematic views 302 and 304 of grid array capacitors and a graph 350 depicting insertion loss characteristics of various grid array capacitors, according to embodiments consistent with the figures. In FIG. 3A, two-terminal circuit 302 includes capacitor C1 and parasitic inductors L1 and L2, series connected between terminal T1 and GND. In FIG. 3B, three-terminal circuit 304 includes capacitor C2 and parasitic inductors L3, L4 and L5, interconnected between terminals T2, T3 and GND.

In general, two-terminal capacitor structures have an ESL greater than that of comparable three-terminal capacitors, which can make a two-terminal capacitor less effective in decoupling and AC coupling applications. Three-terminal capacitor structures, e.g., views 108E, 108F, FIGS. 2C-2D, can therefore have lower ESL and higher electrical performance than comparable two-terminal capacitor structures, e.g., 108A, 108B, FIGS. 1C-1D.

FIG. 3C is a capacitor insertion loss characteristics graph 350 that depicts, insertion loss (dB) 352, versus frequency (MHz) 362 plotted against the x-axis for four types of capacitors. Plots include a two-terminal capacitor 354, three-terminal capacitors 356 and 358, and an ideal capacitor 360. Across the frequency range 362, when compared to ideal capacitor 360, two-terminal capacitor 354 has the smallest frequency range where insertion loss is lower than the ideal capacitor 360, whereas three-terminal capacitors 356 and 358 have significantly enhanced frequency ranges where insertion loss is lower than the ideal capacitor 360. These enhanced frequency ranges can be viewed as indicating enhanced electrical performance of three-terminal capacitors over two-terminal capacitors in decoupling and AC coupling applications, as described herein.

Figure 4B:
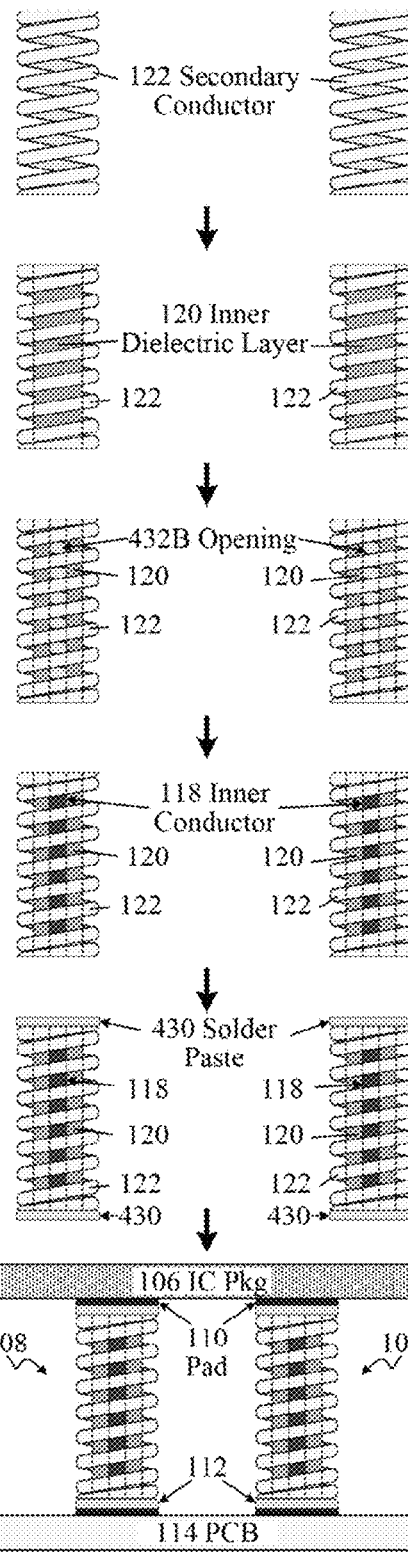
FIG. 4B is a pictorial flow chart of a side view of the grid array capacitor at corresponding operations in the process shown in FIG. 4A.
Figure 4C:
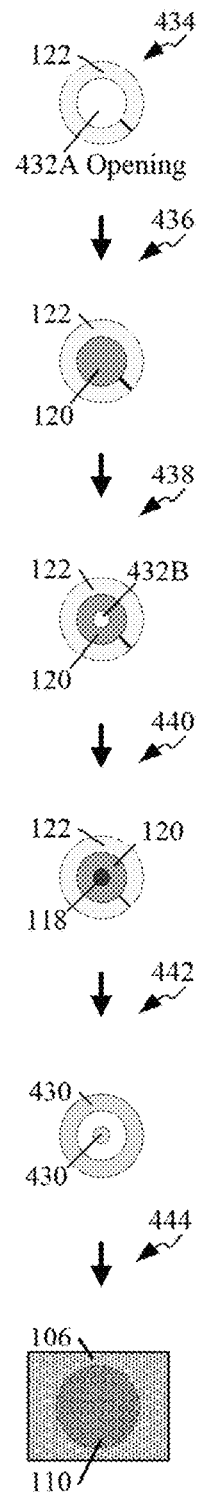
FIG. 4C is a pictorial flow chart of a top view of the grid array capacitor at corresponding operations in the process shown in FIG. 4A.

FIGS. 4A-4C includes a flow diagram 400 and a corresponding sequential set of six side and top process diagram views 434-444 for operations depicting a method for manufacturing a grid array capacitor 108 that is located between an IC package 106 and a PCB 114, according to embodiments consistent with the figures. These process diagram views illustrate an example process; other views and operations can be possible. An electronic system formed by these process operations can be consistent with 100, FIGS. 1A-1B, and can have grid array capacitors 108 (FIGS. 1C-2D) that provide enhanced capacitance characteristics and increased interconnection reliability. Each grid array capacitor 108 is configured to electrically and mechanically interconnect an IC package 106 to a PCB 114, according to embodiments. Example ICs can include processors, GPUs, memory devices, ASICs, and the like. Example PCBs can include daughter cards motherboards, and standalone PCBs.

The execution of method 400 can result in an electronic system, e.g., electronic system 100, FIGS. 1A-1B, having enhanced capacitance characteristics and increased interconnection reliability. An electronic system fabricated according to embodiments can also have improved compensation for non-planarity of PCBs and/or IC packages and grid array capacitor 108 size inconsistencies. Embodiments of the present disclosure are generally consistent with existing ICs, electronic packages, PCBs, as well as existing design methodologies and electronic system fabrication technologies and methods.

The progression depicted in views 434-444 begins with a secondary conductor 122, and ends with a completed electronic assembly of view 444. Process operations can be completed using processes and materials presently used for electronic system fabrication, such as drilling, alignment, placement, insertion, and solder processes, and solder paste 430.

For ease of illustration, only 2 grid array capacitors 108 are shown in FIGS. 4A-4C, however, in the practice of the present disclosure, many grid array capacitors 108 can be used, in an array arrangement, to provide mechanical and electrical interconnections between an IC package 106 and a PCB 114. It can be understood that the operations depicted in FIGS. 4A-4C can be performed in conjunction with one or more fixtures used to hold various elements, e.g., secondary conductor 122 and inner dielectric 120 in place during an assembly operation. Such a fixture could include openings or holes arranged to hold such elements in a stationary position during an assembly process.

For ease of discussion a single label, e.g., view 434, can be used for both a top view and a side view in FIGS. 4B-4C, in order to identify various entities and elements depicted in the Figures and discussed in the Specification. It can be understood that within the following discussion, elements referred to may be included in one or both of the associated side and top view(s).

For ease of illustration, secondary conductors 122 are included within the views 434-444 as generic representations of helical structures/springs. It can be understood that these representations depicted herein in FIGS. 4B-4C can represent secondary conductors 122 of any size or proportion useful for particular applications. In some embodiments not depicted, secondary conductors 122 can also represent conductive columnar sleeves or conductive cylinders.

The results of one or more process operations can be depicted in each view. For example, a view can depict the results a positioning operation and a solder reflow operation which can include alignment and positioning of grid array capacitors 108 adjacent to an IC package 106 and a PCB 114, and subsequently reflowing of solder to attach grid array capacitors 108 to the IC package 106 and to the PCB 114. Processing operations associated with views 434-444 can include, but are not limited to: insertion of a inner dielectric 120 within an opening of a secondary conductor 122, forming an opening in the inner dielectric 120, inserting a inner conductor 118 within the opening, applying solder paste to ends of the grid array capacitor 108, positioning/aligning a IC package 106 and a PCB 114 with the grid array capacitors 108 and a solder reflow operation used to form an assembly of the IC package 106, PCB 114 and grid array capacitors 108.

Completed structures can be generally shown in views 434-444 as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

Unless explicitly directed towards another figure or view, it can be understood that textual references to figure elements contained within a discussion of an operation of method 400 generally refer to a corresponding view immediately to the right of the discussed operation box of flow diagram 400.

View 434 depicts a secondary conductor 122 as a conductive helical structure or spring, having an opening 432A. In some embodiments, secondary conductor 122 can be a hollow conductive cylindrical structure such as a metal tube or "sleeve." According to embodiments, secondary conductor 122 can be fabricated from electrically conductive materials such as copper, tin, nickel, silver or gold. In some embodiments, secondary conductor 122 can be tinned with various solder types in order to facilitate a solder reflow operation. Secondary conductor 122 includes an axially-oriented opening 432A.

Method 400 moves from start 402 to operation 406. Operation 406 generally refers to inserting an inner dielectric 120 into the axially-oriented opening 432A of a secondary conductor 122. According to embodiments, automated electronic equipment can be used to align and insert an inner dielectric 120 or "plug" into the axially-oriented opening 432A of a secondary conductor 122. Such a plug can include high Dk materials such as polyimide and/or barium titanate. Once the inner dielectric is inserted into an axially-oriented opening, the method 400 moves to operation 408.

Operation 408 generally refers to forming, in the inner dielectric 120, an opening 432B that is suitable to receive an inner conductor 118. According to embodiments, opening 432B is approximately the size, within manufacturing tolerances, of an inner conductor 118, view 440, to be inserted into opening 432B. Opening 432B can be formed using classical mechanical drilling, laser drilling, or other suitable manufacturing methods or processes. Once the opening is formed in the inner dielectric, the method 400 moves to operation 410.

Operation 410 generally refers to inserting the inner conductor 118 into the opening 432B in the inner dielectric 120. According to embodiments, an inner conductor 118 is approximately the size of opening 432B, within manufacturing tolerances. In embodiments, automated electronic equipment can be used to align and insert inner conductor 118 into the axially-oriented opening 432B of a secondary conductor 122. In some embodiments, the inner conductor 118 is a wire that can include materials such as copper, tin, nickel, niobium and titanium. Once the inner conductor is inserted into the opening in the inner dielectric, the method 400 moves to operation 412.

Operation 412 generally refers to applying solder paste 430 to opposing ends 116A, 116B of the secondary conductor 122 and to opposing ends 116A and 116B of the inner conductor 118. Solder masks, pastes, and solder spreading equipment consistent with equipment used to apply solder paste to BGA pads of PCBs can be used for this operation. Alternately, solder paste can be applied to IC package 106 and PCB 114, view 444. Once the solder paste 430 is applied to ends of the secondary conductor and the inner conductor, the method 400 moves to operation 414.

Operation 414 generally refers to electrically and mechanically interconnecting the grid array capacitor 108 to IC package 106 and to PCB 114 by reflowing the solder paste 430. Operation 414 includes positioning and aligning IC package 106, grid array capacitor 108 and PCB 114 in a suitable orientation that includes the ends 116A, 116B (FIG. 1C), of grid array capacitors 108, solder paste 430, and interconnect pads 110 of IC package 106 and PCB 114 being in physical contact. Once this contact is established, a thermal profile is applied by a device such as a specialized reflow oven, using a specified temperature profile, consistent with reflow operations used to attach solder balls to PCBs. The solder paste 430 is brought to at least a melting point and then cooled, joining grid array capacitors 108, solder paste 430, IC package 106 and PCB 114 into an assembly. Once the grid array capacitor is electrically and mechanically interconnected to IC package 106 and to PCB 114, the method 400 may end at block 416.

In the practice of the present disclosure, additional optional operations can be performed in order to add an outer dielectric 224 and an outer conductor 226, consistent with views 108E and 108F, FIGS. 2C-2D, to the completed assembly, as described above.

For example, outer dielectric 224 and outer conductor 226 can be formed together, and subsequently positioned so as to surround inner conductor 118, inner dielectric 120 and secondary conductor 122. Following this example, outer conductor 226 can be formed as a hollow cylindrical conductive tube, and the inner surface subsequently coated with outer dielectric 224 with a process such as spraying, or dipping. Alternatively, a sheet of conductive material, e.g., copper, can be coated on one surface with outer dielectric 224, and subsequently rolled or stamped to form a cylindrical shape. Following the fabrication of the outer dielectric 224/outer conductor 226 assembly, this assembly can be positioned so as to surround the secondary conductor 122.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A grid array capacitor located between an integrated circuit (IC) package and a printed circuit board (PCB), the grid array capacitor configured to be physically and electrically coupled to the IC package and to the PCB, the grid array capacitor comprising:
   an inner conductor configured to be electrically connected to the IC package and to the PCB, wherein the inner conductor is a helical coil;
   an inner dielectric in a coaxial orientation to and at least partially surrounding the inner conductor; and
   a secondary conductor in a coaxial orientation to and at least partially surrounding the inner dielectric, the secondary conductor configured to be electrically connected to the IC package and to the PCB.

2. The grid array capacitor of claim 1 further comprising:
   an outer dielectric in a coaxial orientation to and at least partially surrounding the secondary conductor; and
   an outer conductor in a coaxial orientation to and at least partially surrounding the outer dielectric, the outer conductor configured to be electrically connected to the IC package and to the PCB.

3. The grid array capacitor of claim 2, wherein the outer dielectric is selected from the group consisting of: polyimide and barium titanate.

4. The grid array capacitor of claim 1, wherein the inner conductor is a wire.

5. The grid array capacitor of claim 1, wherein the secondary conductor includes materials selected from the group consisting of: copper, tin, nickel, niobium and titanium.

6. The grid array capacitor of claim 1, wherein a capacitance of the grid array capacitor is in a range between 1 nF and 8 nF.

7. The grid array capacitor of claim 1, wherein the secondary conductor is a helical coil.

8. The grid array capacitor of claim 1, wherein the secondary conductor is a hollow cylindrical sleeve.

9. An electronic system comprising:
   a printed circuit board (PCB);
   an integrated circuit (IC) package;
   a grid array capacitor located between the IC package and the PCB, the grid array capacitor physically and electrically coupled to the IC package and to the PCB, the grid array capacitor comprising:
      an inner conductor physically and electrically connected to the IC package and to the PCB, wherein the inner conductor is a helical coil;
      an inner dielectric in a coaxial orientation to and at least partially surrounding the inner conductor; and
      a secondary conductor in a coaxial orientation to and at least partially surrounding the inner dielectric, the secondary conductor physically and electrically connected to the IC package and to the PCB.

10. The electronic system of claim 9, wherein the secondary conductor is a helical coil.

11. The electronic system of claim 9, wherein the secondary conductor is a hollow cylindrical sleeve.

12. The electronic system of claim 9, wherein the inner dielectric is selected from the group consisting of: polyimide and barium titanate.

13. A grid array capacitor located between an integrated circuit (IC) package and a printed circuit board (PCB), the grid array capacitor configured to be physically and electrically coupled to the IC package and to the PCB, the grid array capacitor comprising:
- an inner conductor configured to be electrically connected to the IC package and to the PCB;
- an inner dielectric in a coaxial orientation to and at least partially surrounding the inner conductor; and
- a secondary conductor in a coaxial orientation to and at least partially surrounding the inner dielectric, the secondary conductor configured to be electrically connected to the IC package and to the PCB;
- wherein the secondary conductor includes a first section adjacent to a first end and a second section adjacent to a second end, wherein the first section and the second section are spaced and electrically insulated from each other in a longitudinal direction of the coaxial orientation.

* * * * *